(12) United States Patent
Kim

(10) Patent No.: US 6,200,826 B1
(45) Date of Patent: Mar. 13, 2001

(54) METHOD OF FABRICATING A REVERSE MESA RIDGE WAVEGUIDE TYPE LASER DIODE

(75) Inventor: Ang-Seo Kim, Ich'on (KR)

(73) Assignee: Hyundai Electronics Industries Co., Ltd., Ich'on (KR)

( * ) Notice: Subject to any disclaimer, the term of this patent is extended or adjusted under 35 U.S.C. 154(b) by 0 days.

(21) Appl. No.: 08/996,581

(22) Filed: Dec. 23, 1997

(30) Foreign Application Priority Data

Dec. 30, 1996 (KR) ................................................ 96-77721

(51) Int. Cl.⁷ .......................... H01L 21/20; H01L 21/306
(52) U.S. Cl. ................................................................ 438/31
(58) Field of Search .................... 438/22, 29, 31, 438/40, 46, FOR 289; 372/46

(56) References Cited

U.S. PATENT DOCUMENTS

| | | | |
|---|---|---|---|
| 4,994,143 | 2/1991 | Kim | 156/649 |
| 5,197,077 | 3/1993 | Harding et al. | 372/45 |
| 5,420,066 * | 5/1995 | Shima et al. | 438/40 |
| 5,770,474 * | 6/1998 | Kim | 438/31 |
| 5,834,329 * | 11/1998 | Kim | 438/40 |

FOREIGN PATENT DOCUMENTS

| | | | |
|---|---|---|---|
| 59-54283A * | 3/1984 | (JP) | 372/46 |
| 60-85585A * | 5/1985 | (JP) | 372/46 |
| 60-251689A * | 12/1985 | (JP) | 372/46 |
| 62-189784 | 8/1987 | (JP) . | |
| 1-236680 | 9/1989 | (JP) . | |
| 1-239890 | 9/1989 | (JP) . | |
| 1-298784 | 12/1989 | (JP) . | |
| 5-198894 | 8/1993 | (JP) . | |
| 5-234982 | 9/1993 | (JP) . | |
| 6-077605 | 3/1994 | (JP) . | |
| 6-196812 | 7/1994 | (JP) . | |
| 6-338654A * | 12/1994 | (JP) | 372/46 |
| 7-297483 | 11/1995 | (JP) . | |
| 8-335750 | 12/1996 | (JP) . | |

OTHER PUBLICATIONS

"Inp–Based Reversed–Mesa Ridge–Waveguide Structure For High–Performance Long–Wavelength Laser Diodes" by Aoki et al, IEEE Journal of Selected Topics in Quantum Electronics, vol. 3, No. 2, Apr. 1977 pp. 672–683.*

* cited by examiner

*Primary Examiner*—Savitri Mulpuri

(57) ABSTRACT

The present invention provide a reverse mesa ridge waveguide type laser diode and a method of fabricating the same. A laser diode according to the present invention includes: a compound semiconductor substrate of a first conductivity type having an upper surface and a lower surface opposite the upper surface; a buffer layer of the first conductivity type, an active layer and a waveguide layer of a second conductivity type which are sequentially formed on the upper surface of the substrate; a waveguide control layer of the second conductivity type formed on the waveguide layer and having a predetermined width; a clad layer of the second conductivity type and a contact layer of the second conductivity type sequentially formed on the waveguide control layer and having a shape of a reverse mesa ridge whose lower portion has wider width than width of the waveguide control layer; a protection layer formed on the upper surface of the substrate, exposing the contact layer in an upper portion of reverse mesa ridge and protecting the reverse mesa ridge; a polyimide layer formed on the protection layer and filling both side portions of the reverse mesa ridge; an ohmic metal layer of the second conductivity type formed on the substrate and contacted with the exposed portion of the contact layer; and an ohmic metal layer of the first conductivity type formed on the lower surface of the substrate.

11 Claims, 3 Drawing Sheets

METHOD OF FABRICATING A REVERSE MESA RIDGE WAVEGUIDE TYPE LASER DIODE

BACKGROUND OF THE INVENTION

1. Field of the Invention

The present invention relates to an optical device and method of fabricating the same, and more particularly to a reverse mesa ridge waveguide type laser diode and method of fabricating the same.

2. Discussion of Related Art

A laser diode, which receives current and outputs laser light, is used as an optical signal generation source in optical communications systems, and as a light source for an instrumentation equipment, information processing apparatus and pointer.

FIG. 1 is a cross-sectional view showing a conventional forward mesa ridge waveguide type laser diode. As shown in FIG. 1, a N-type buffer layer 2, a active layer 3, a P-type waveguide layer 4, an etch stop layer 5, a P-type clad layer 6 and a P-type contact layer 7 are sequentially formed on a N-type substrate 1 by metal organic chemical vapor deposition (MOCVD) technique. The contact layer 7 and the clad layer 6 are etched to form a forward mesa ridge. An oxide layer 8 acting as a protection layer is formed on the entire surface of the substrate uniformly so as to expose the upper surface of the forward mesa ridge. A P-type ohmic metal layer 9 is formed on the substrate such that it contacts with the exposed surface of the forward mesa ridge. A N-type ohmic metal layer 10 is then formed beneath the substrate 1.

Although it is easy to fabricate the above-described forward mesa ridge waveguide type laser diode, the laser of multiple mode may be generated from it due to its wide waveguide width. To overcome this problem, a reverse mesa ridge waveguide type laser diode has been proposed.

FIG. 2 is a cross-sectional view showing the conventional reverse mesa ridge waveguide type laser diode.

As shown in FIG. 2, a N-type buffer layer 12, an active layer 13, a P-type waveguide layer 14, an etch stop layer 15, a P-type clad layer 16 and a P-type contact layer 17 are sequentially formed on a N-type substrate 11 by MOCVD technique. The contact layer 17 and the clad layer 16 are etched to form a reverse mesa ridge. An oxide layer 10 acting as a protection layer is formed on the substrate uniformly so as to expose the upper surface of the reverse mesa ridge. A polyimide layer 19 is filled in the etched portions at both sides of the reverse mesa ridge. A P-type ohmic metal layer 18 is formed on the entire surface of the substrate such that it contacts with the exposed surface of the reverse mesa ridge. A N-type ohmic metal layer 21 is formed beneath the substrate 11.

Since the waveguide width in the laser diode as shown in FIG. 2 is narrow due to the reverse mesa ridge, it is possible to generate a single-mode laser. Furthermore, the contact resistance and serial resistance are reduced due to the wide upper width of the ridge. However, to decrease the waveguide width with increasing the upper width of the ridge, it is preferable that the clad layer 16 is thick. In result, the laser diode as showing in FIG. 2 has a serial resistance higher than that of a planar buried heterostructure (PBH) laser diode.

SUMMARY OF THE INVENTION

One object of the present invention is to provide a reverse mesa ridge waveguide type laser diode capable of generating easily a laser of a single-mode and decreasing a contact resistance and a serial resistance.

Furthermore, another object of the present invention is to provide a method of fabricating the above laser diode.

To achieve the one object, a laser diode according to the present invention includes : a compound semiconductor substrate of a first conductivity type having an upper surface and a lower surface opposite the upper surface; a buffer layer of the first conductivity type, an active layer and a waveguide layer of a second conductivity type which are sequentially formed on the upper surface of the substrate; a waveguide control layer of the second conductivity type formed on the waveguide layer and having a predetermined width; a clad layer of the second conductivity type and a contact layer of the second conductivity type sequentially formed on the waveguide control layer and having a shape of a reverse mesa ridge whose lower portion has wider width than width of the waveguide control layer; a protection layer formed on the upper surface of the substrate, exposing the contact layer in an upper portion of reverse mesa ridge and protecting the reverse mesa ridge; a polyimide layer formed on the protection layer and filling both side portions of the reverse mesa ridge; an ohmic metal layer of the second conductivity type formed on the substrate and contacted with the exposed portion of the contact layer; and an ohmic metal layer of the first conductivity type formed on the lower surface of the substrate.

Furthermore, to achieve the another object, a laser diode according to the present invention is fabricated by the following processes. First, a buffer layer of a first conductivity type, an active layer, a waveguide layer of a second conductivity type, a waveguide control layer of the second conductivity type, a clad layer of the second conductivity type, and a contact layer of the second conductivity type are formed on the upper surface of a compound semiconductor substrate of the first conductivity type having an upper surface and a lower surface opposite the upper surface, in sequence. Next, the contact layer and the clad layer to form a reverse mesa ridge whose upper and lower portions have a predetermined widths are etched. The waveguide control layer is then selectively etched such that it has the width narrower than the upper portion of the reverse mesa ridge. Thereafter, a protection layer is formed on the substrate to protect the reverse mesa ridge. A polyimide layer is then formed on the protection layer at both sides of the reverse mesa ridge to fill the etched portions at both sides of the reverse mesa ridge. Next, the protection layer is partially removed to expose the contact layer of the upper reverse mesa ridge. Afterward, an ohmic metal layer of the second conductivity type is formed on the lower surface of the substrate to contact with the exposed portion of the contact layer and an ohmic metal layer of the first conductivity type is then formed on the lower surface of the substrate.

According to the present invention, since the waveguide width is selectively controlled by the waveguide control layer which is formed thereon, the upper and lower portions of the reverse mesa ridge have wide width. In result, it is easy to generate a single mode laser and a contact resistance and. In addition, a serial resistance of the laser diode are reduced.

DETAILED DESCRIPTION OF PREFERRED EMBODIMENT

Hereinafter, a preferred embodiment of the present invention will be explained in more detail with reference to the accompanying drawings.

FIGS. 3A to 3E are cross-sectional views showing a method of fabricating a reverse mesa ridge waveguide type laser diode according to an embodiment of the present invention. The laser diode according to the present embodiment is in an InP group having an oscillation wavelength of 1.3 μm.

Figure 1:
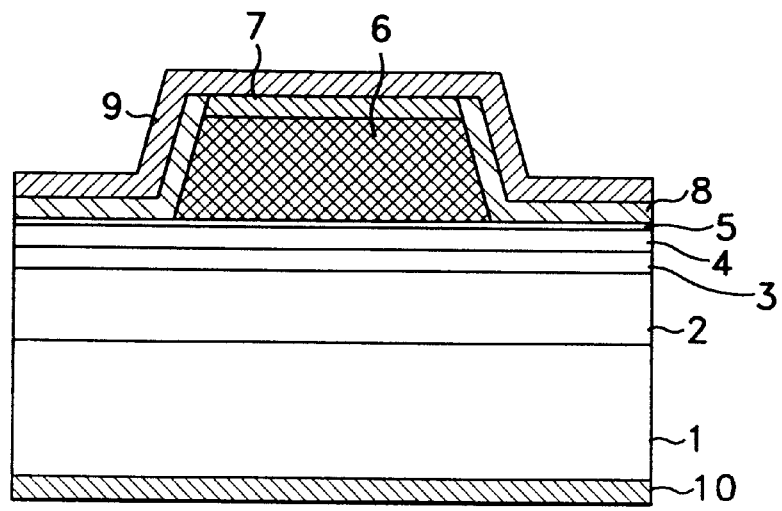
FIG. 1 is a cross-sectional view showing a conventional forward mesa ridge waveguide type laser diode.
Figure 2:
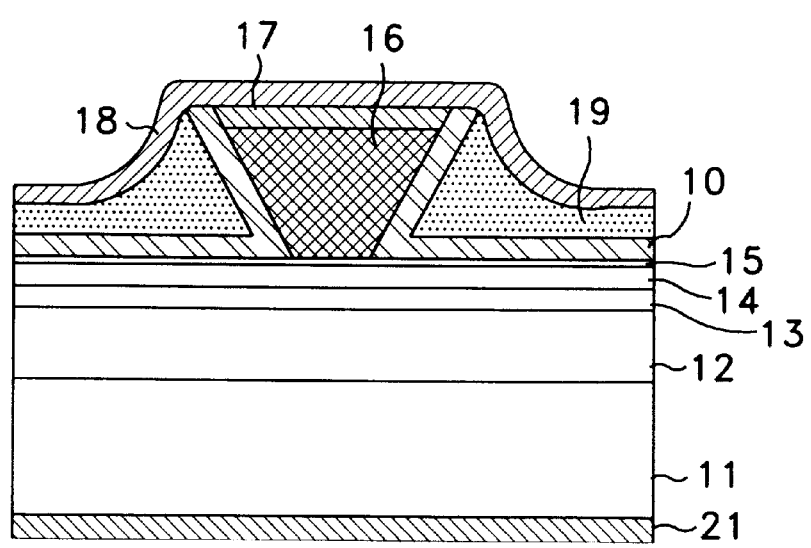
FIG. 2 is a cross-sectional view showing a conventional reverse mesa ridge waveguide type laser diode.
Figure 3A:
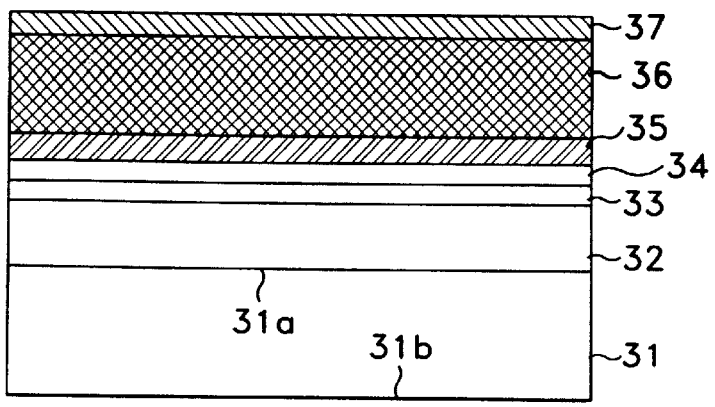
FIGS. 3A to 3E are cross-sectional views showing a method of fabricating a reverse mesa ridge waveguide type laser diode according to an embodiment of the present invention.

As shown in FIG. 3A, a N-type buffer layer 32 is grown on the upper surface 31a of a N$^+$-InP substrate 31 having an upper surface 31a and a lower surface 31b opposite the upper surface 31a and an U-InGaAsP non-buried active layer 33 having an oscillation wavelength of 1.3 μm is grown thereon. A P-InP waveguide layer 34 is grown on the U-InGaAsP active layer 33 and a P-InGaAsP waveguide control layer 35 for controlling selectively the waveguide width of the waveguide layer 34 is then formed thereon. The waveguide control layer 35 is an InP group and its material wavelength is 1.1 μm to 1.3 μm in case of the oscillation wavelength of 1.3 μm. Next, a P-InP clad layer 36 and P$^+$-InGaAs contact layer 37 are sequentially grown on the P-InGaAsP waveguide control layer 35. These compound semiconductor layers are grown by MOCVD technique.

Figure 3B:
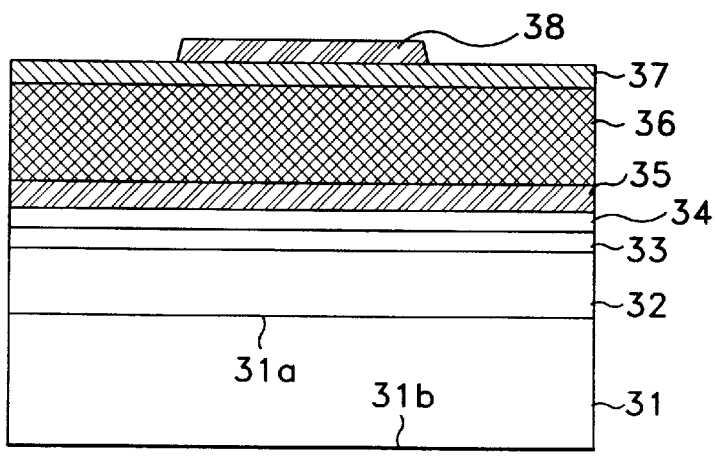
Figure 3C:
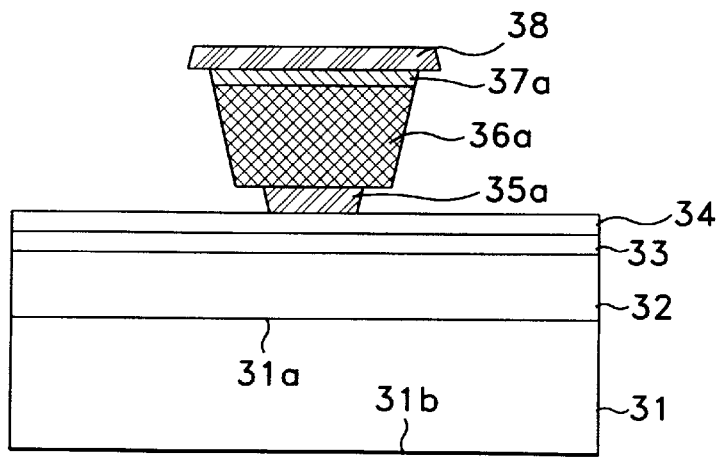

As shown in FIG. 3B, a silicon oxide layer pattern 38 is formed on the P$^+$-InGaAs contact layer 37 so as to act an etch mask during etching process for forming a reverse mesa ridge. As shown in FIG. 3C, the P$^+$-InGaAs contact layer 37 is selectively etched by wet etching using the silicon oxide layer pattern 38 as an etch mask. The wet etching is carried out using a mixed solution of $H_3PO_4$, $H_2O_2$ and $H_2O$. The P-InP clad layer 36 existing under the P$^+$-InGaAs contact layer 37 is selectively etched by a wet etching using a mixed solution of HBr and $H_2O$, thereby forming a reverse mesa ridge. Afterward, the P-InGaAsP waveguide control layer 35 is selectively etched such that its width is narrower than that of the lower portion of the P-InP clad layer 36. Here, the width of the P-InGaAsP waveguide control layer 35 is narrow enough to generate a single mode of laser. More specifically, since the width of the waveguide of the waveguide layer 34 is selectively controlled by overlying the P-InGaAsP waveguide control layer 35, it is possible to widely form the upper and lower portions of the reverse mesa ridge regardless of the waveguide width. Then, the silicon oxide layer pattern 38 is removed by a well-known method, as shown in FIG. 3D.

Figure 3D:
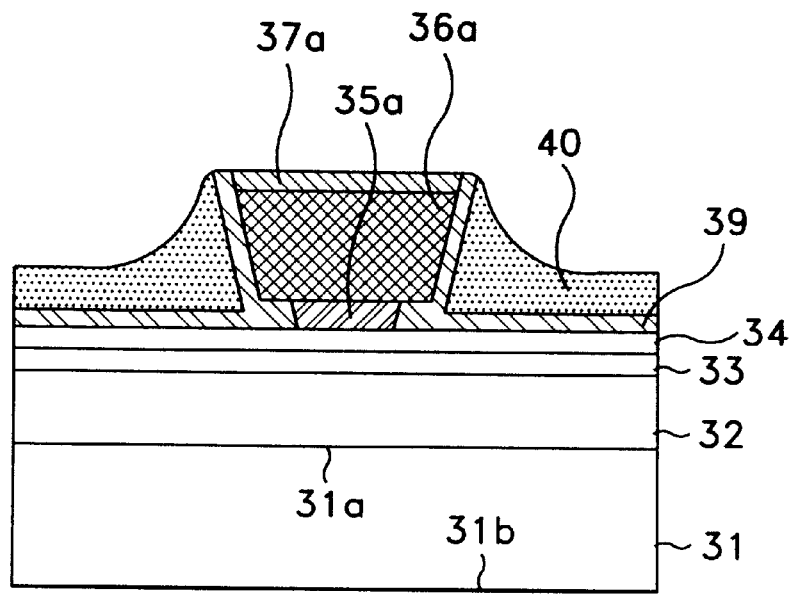

Referring to FIG. 3D, a protection layer 39 is then formed on the surface so as to protect the reverse mesa ridge. The protection layer 39 is, preferably, silicon oxide layer. A polyimide layer 40 is formed on the protection layer 39 at both sides of the reverse mesa ridge so as to fill the etched portions at both sides of the reverse mesa ridge. The polyimide layer 40 prevents a break of a P-type ohmic metal layer which will be formed later. Next, the protection layer 39 is removed so as to expose the P$^+$-InGaAs contact layer 37a in the upper portion of the reverse mesa ridge.

Figure 3E:
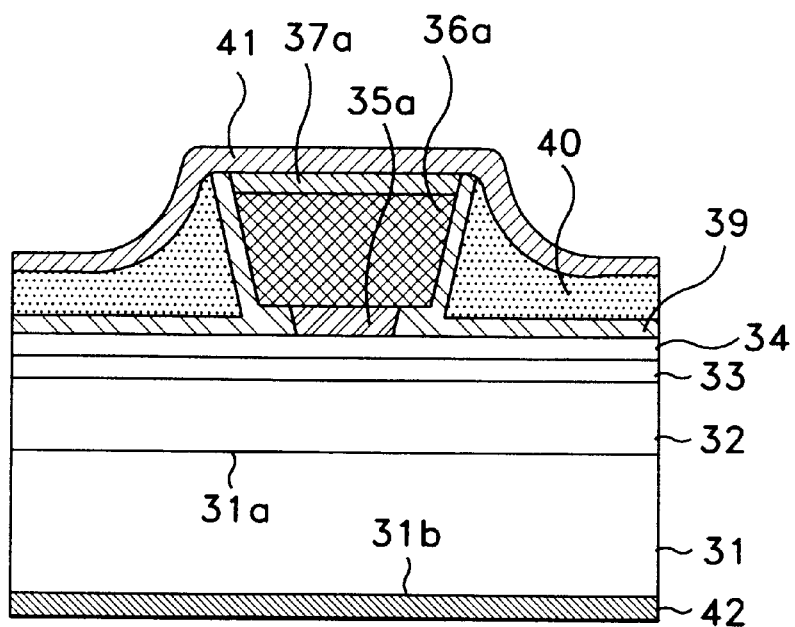

As shown in FIG. 3E, a P-type ohmic metal layer 41 is formed to contact with the exposed P$^+$-InGaAs contact layer 37. The P-type ohmic metal layer 41 is made of a stacked layer of Ti layer, Pt layer and Au layer, and Au plating layer is formed thereon. A N-type ohmic metal layer 42 is then formed on the lower surface 31b of the substrate 31. The N-type ohmic metal layer 42 is made of a stacked layer of AuGe layer, Ni layer and Au layer, and Au plating layer is formed thereon.

According to the above described embodiment, since the waveguide width is selectively controlled by the P-InGaAsP waveguide control layer 36a which is formed thereon, the upper and lower widths of the reverse mesa ridge is formed widely. In result, it is easy to generate a single mode laser and to reduce a contact resistance and a serial resistance of the laser diode. Therefore, heat emission during operating of the laser diode decreases to thereby enable high level ouput. Furthermore, since it is possible that the laser diode can be operated at high temperature, available temperature range is widened and frequency property is improved. In addition, the threshold current of the laser diode decreases, to thereby improve the reliability of the laser diode.

Although the above embodiment is described with reference to the laser diode of InP group having oscillation wavelength of 1.3 μm, the present invention can be applied to a laser diode having oscillation wavelength of 1.55 μm or a laser diode of GaAs group. In case of the oscillation wavelength of 1.55 μm, the waveguide control layer is formed of InGaAsP of which material wavelength is 1.33 μm or InGaAsP having a short wavelength less than 1.55 μM. Furthermore, in case of the laser diode of GaAs group, the waveguide control layer is formed of a material having a refractive index lower than that of the active layer and having band gab energy higher than the active layer.

While this invention has been described with reference illustrative embodiments, this description is not intended to be construed in a limiting sense. Various modifications of illustrative embodiments, as well as other embodiments of the invention, will be apparent to persons skilled in the art upon reference to this description. It is therefore contemplated that the appended claims will cover any such modifications of embodiments as falling within the true scope of the invention.

What is claimed is:

1. A method of fabricating a laser diode, comprising the steps of:

forming a buffer layer of a first conductivity type, an active layer, a waveguide layer of a second conductivity type, a waveguide control layer of the second conductivity type, a clad layer of the second conductivity type, and a contact layer of the second conductivity type in sequence on an upper surface of a compound semiconductor substrate of the first conductivity type having a lower surface opposite the upper surface;

etching the contact layer and the clad layer to form a reverse mesa ridge whose upper and lower portions have predetermined widths; and selectively etching the waveguide control layer such that it has a width narrower than the lower portion of the reverse mesa ridge.

2. The method as claimed in claim 1, further comprising the steps of:

forming a protection layer on the substrate to protect the reverse mesa ridge;

forming a polyimide layer on the protection layer at both sides of the reverse mesa ridge to fill the etched portions at both sides of the reverse mesa ridge;

removing partially the protection layer to expose the contact layer of the upper reverse mesa ridge; and forming an ohmic metal layer of the second conductivity type on the upper surface of the substrate to contact with the exposed portion of the contact layer; and forming an ohmic metal layer of the first conductivity type on the lower surface of the substrate.

3. The method as claimed in claim 1, wherein the substrate is formed of an InP group material, and the active layer has oscillation wavelength of 1.3 $\mu$m.

4. The method as claimed in claim 3, wherein the compound semiconductor substrate is formed of $N^+$-InP layer, the buffer layer is formed of N-InP layer, the active layer is formed of U-InGaAsP, the waveguide layer is formed of P-InP, the waveguide control layer is formed of P-InGaAsP, the clad layer is formed of P-InP, and the contact layer is formed of $P^+$-InGaAs.

5. The method as claimed in claim 4, wherein the material wavelength of the waveguide control layer is 1.1 $\mu$m to 1.3 $\mu$m.

6. The method as claimed in claim 4, wherein during the step of forming the reverse mesa ridge, the contact layer is etched by wet etching using a mixed solution of $H_3PO_4$, $H_2O_2$ and $H_2O$.

7. The method as claimed in claim 4, wherein during the step of forming the reverse mesa ridge, the clad layer is etched by a wet etching using a mixed solution of HBr and $H_2O$.

8. The method as claimed in claim 1, wherein the substrate is made of an InP group material, and the active layer has an oscillation wavelength of 1.55 $\mu$m.

9. The method as claimed in claim 8, wherein the waveguide control layer is InGaAsP layer and its material wavelength is 1.3 $\mu$m to 1.55 $\mu$m.

10. The method as claimed in claim 1, wherein the substrate is made of a GaAs group material.

11. The method as claimed in claim 10, wherein the waveguide control layer is made of a material having a refractive index lower than that of the active layer and having band gab energy higher than that of the active layer.

* * * * *

UNITED STATES PATENT AND TRADEMARK OFFICE
CERTIFICATE OF CORRECTION

PATENT NO.   : 6,200,826 B1
DATED        : March 13, 2001
INVENTOR(S)  : Ang-Seo Kim Page 1 of 1

It is certified that error appears in the above-identified patent and that said Letters Patent is hereby corrected as shown below:

Column 4,
Line 9, cancel "36a" and substitute -- 35a --.
Line 27, cancel "$\mu$M" and substitute -- $\mu$m --.

Signed and Sealed this

Twenty-eighth Day of August, 2001

Attest:

NICHOLAS P. GODICI
Attesting Officer    Acting Director of the United States Patent and Trademark Office